US008341504B2

(12) United States Patent
Hassan et al.

(10) Patent No.: US 8,341,504 B2
(45) Date of Patent: Dec. 25, 2012

(54) FAST AND RELIABLE WIRELESS COMMUNICATION

(75) Inventors: Amer A. Hassan, Kirkland, WA (US); Billy R. Anders, Jr., Bothell, WA (US)

(73) Assignee: Microsoft Corporation, Redmond, WA (US)

( * ) Notice: Subject to any disclaimer, the term of this patent is extended or adjusted under 35 U.S.C. 154(b) by 337 days.

(21) Appl. No.: 12/721,911

(22) Filed: Mar. 11, 2010

(65) Prior Publication Data

US 2011/0225479 A1 Sep. 15, 2011

(51) Int. Cl.
*H03M 13/00* (2006.01)
(52) U.S. Cl. ........................................ 714/776
(58) Field of Classification Search ........................ None
See application file for complete search history.

(56) References Cited

U.S. PATENT DOCUMENTS

| | | | |
|---|---|---|---|
| 6,418,549 B1 | 7/2002 | Ramchandran | |
| 6,594,791 B2 | 7/2003 | Sipola | |
| 6,625,165 B1 | 9/2003 | Krishnamoorthy | |
| 6,842,445 B2 | 1/2005 | Ahmavaara | |
| 7,487,430 B2* | 2/2009 | Kim et al. | 714/779 |
| 7,609,697 B2 | 10/2009 | Nishida | |
| 7,653,028 B2* | 1/2010 | Shiu et al. | 370/335 |
| 2002/0041584 A1* | 4/2002 | Sashihara | 370/337 |
| 2004/0107398 A1* | 6/2004 | Johnson | 714/758 |
| 2007/0130495 A1* | 6/2007 | Yoon et al. | 714/758 |
| 2009/0055715 A1* | 2/2009 | Jashek et al. | 714/776 |
| 2009/0103480 A1 | 4/2009 | Tong | |
| 2009/0199061 A1 | 8/2009 | Lee | |
| 2009/0307559 A1 | 12/2009 | Wu | |
| 2012/0039264 A1* | 2/2012 | Kim et al. | 370/329 |

OTHER PUBLICATIONS

Jamieson, K. et al., PPR: Partial Packet Recovery for Wireless Networks—Published Date: 2007 http://docs.google.com/viewer?a=v&q=cache:3giNB7wGXpsJ:nms.lcs.mit.edu/papers/fp315-.
Yao, Y. et al., Performance Enhancement of Mobile Radio Slotted ALOHA Networks Using Retransmission Combining—Published Date: 1992 http://ieeexplore.ieee.org//stamp/stamp.jsp?tp=&arnumber=00245475.

* cited by examiner

*Primary Examiner* — Guerrier Merant
(74) *Attorney, Agent, or Firm* — Capitol City TechLaw; Richard C. Irving

(57) ABSTRACT

A communication system that provides fast and reliable communications. The system is suitable for use in connection with wireless computing devices in which transmission errors may occur because of channel conditions, such as interference. Channel conditions causing transmission errors may be bursty and transient such that the errors temporarily overwhelm an error control code. By combining data received for multiple transmission attempts of a packet that fail error checking or that pass error checking with low reliability, a reliable representation of the packet may be quickly constructed. Though, combining may be omitted when a transmission attempt is received that passes error checking with high reliability.

20 Claims, 5 Drawing Sheets

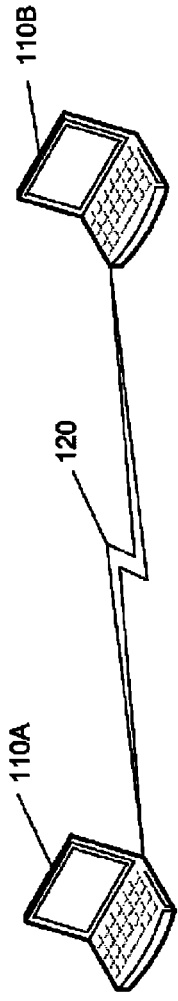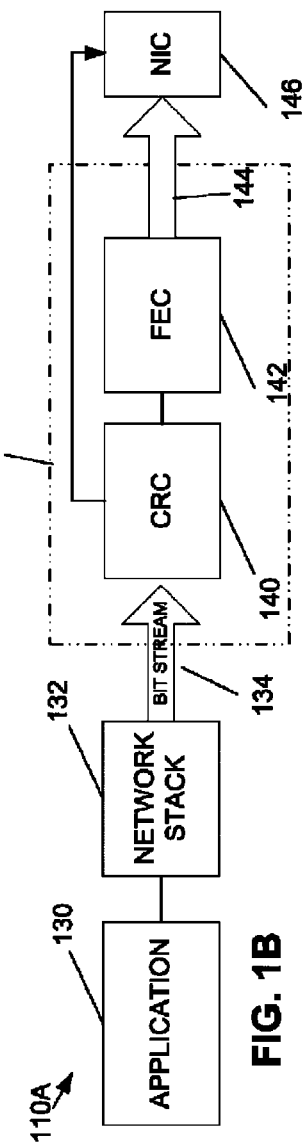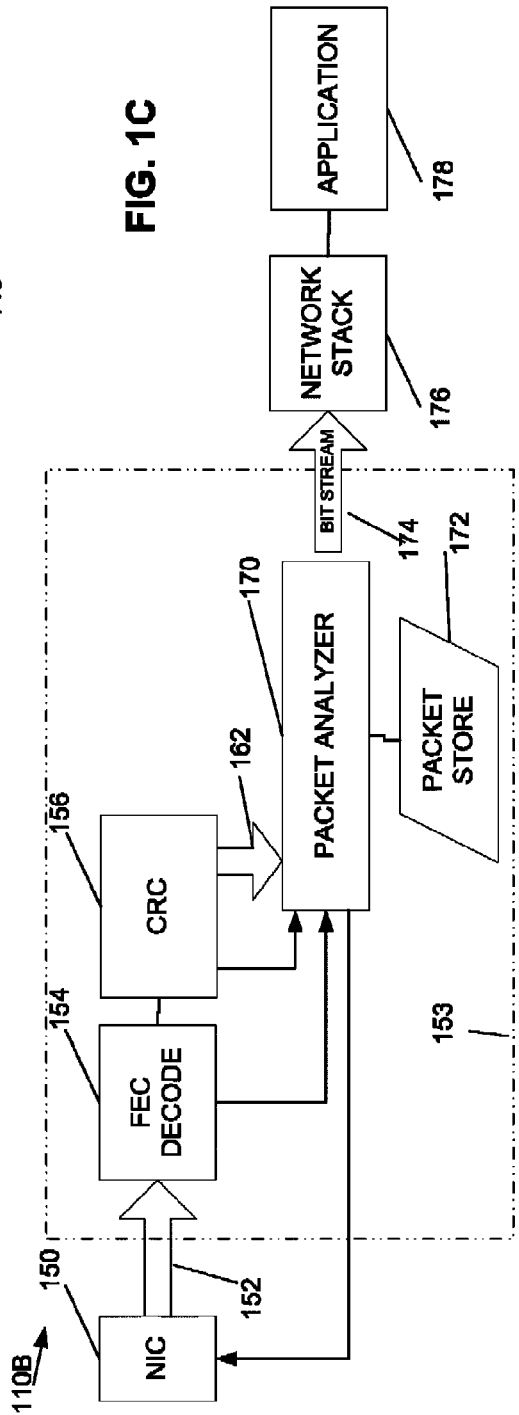

FAST AND RELIABLE WIRELESS COMMUNICATION

BACKGROUND

As computers have grown into important tools that people use in all aspects of their business and personal lives, there has been an increased demand from computer users to have full use of their computers regardless of location. To enable mobile computer use, computers frequently are equipped for wireless communications so that computer users can access information and services when away from their homes or offices. Though, for these functions to be truly useful, it is desirable for wireless communication to be fast and reliable.

To improve the speed and reliability of wireless communications, error control codes are known. Employing an error control code allows a receiving device to determine whether a packet of information has been received with an error. Errors occur, for example, if noise in the communication channel causes the receiving device to incorrectly classify a received signal as representing a pattern of bits different than the pattern of bits that was sent by a transmitting device.

Depending on the characteristics of the error control code, the receiving device, in addition to simply detecting an error, may also be able to determine the nature of the error and correct for it. Some error control codes can correct for multiple errors, with the number of errors that can be corrected being dependent on characteristics of the code. Though, regardless of the characteristics of the error control code, there is a limit on the number of errors that can be corrected. Accordingly, communication protocols account for the possibility that a packet will be received with more errors than can be corrected or will not be received at all.

Some form of feedback between the receiving device and the transmitting device allows the transmitting device to recognize situations in which a packet was not received, which can trigger another attempt to transmit the packet. When a packet is properly received, the receiving device may send an acknowledgement message, sometimes called an ACK. When more errors than can be corrected occur in a packet, the receiving device may send a reply to the transmitting device, indicating that the packet was not received correctly. Such a reply is sometimes called a negative acknowledgement message, or a NAK.

Though, devices operating according to different protocols may signal receipt of a packet or occurrence of errors in a received packet in different ways. For example, in some protocols, a receiving device may not send any NAK when a packet is received with errors. Rather, it will send an ACK to indicate receipt of a packet with no errors or, when an error correcting code is used, receipt of a packet with a number of errors that could be corrected. The transmitting device will infer, if no ACK is received within a limited time, that a transmitted packet was not properly received.

Regardless of how the transmitting device determines that a packet was not received correctly, the transmitting device may respond to such a determination by retransmitting the packet until it receives an ACK or reaches a limit on the number of transmission attempts set by a protocol used by the device.

The ability to detect and correct for errors in received packets can improve the speed and reliability of communications because it avoids the need to retransmit a packet. Though, there are tradeoffs in selecting a desirable error control code. A stronger error control code that can correct for more errors requires that packets contain more bits to send the same amount of information than would be required to send the same packet using a weaker code that can correct for fewer errors. As a result, though a stronger code reduces the number of instances in which a packet has to be retransmitted, this benefit is offset by the requirement for more bits per packet if a stronger code is used. A designer of a communication system may select a strength of an error control code that balances both the positive and negative impacts on transmission speed to provide, on average, improved performance.

In some instances, a better balance can be achieved using nested error codes. Codes are nested by applying a first error control code to bits to be communicated in a packet. A second code may then be applied to the bits as modified using the first code. Further codes can be applied sequentially in this fashion to provide a desired overall code strength. For example, it is known to first apply a cyclic redundancy check, sometimes called CRC, to bits to be transmitted. The CRC is a value selected so that when the CRC is combined in a mathematical operation with other bits in the packet, a known result occurs. If upon receipt, the known result does not occur when that mathematical operation is performed, it can be inferred that an error occurred such that the bits received do not match the bits transmitted. For example, the CRC may be a value that, when added with words formed by grouping the bits in the packet, produces a sum of zero. If, upon receipt, when the CRC is combined with other bits in the packet, the words do not sum to zero, it can be inferred that an error occurred.

A second error control code may be applied to the bits of the packet with the CRC. Forward error correction, or FEC, is an example of such a code. FEC associates each group of bits in a packet to be transmitted to multiple possible similar bit patterns. Even if errors occur in transmission of the packet that change how the receiving device detects the bits of the packet, it is most likely that the receiver will detect one of the similar bit patterns. If so, the receiver can still associate that bit pattern with the group of bits that was transmitted.

SUMMARY

Improved communication is provided by combined processing of multiple received transmission attempts of a packet, including those that pass error checking with low reliability. In some embodiments, an inner error control code may be used to determine whether a received transmission attempt passes error checking. Information gleaned based on applying an outer error control code may be used to assess reliability. Received transmission attempts may be selected for combined processing based on indications of whether received transmission attempts pass error checking and the reliability of the result.

If a received transmission attempt passes error checking with a reliability above a threshold, the data in that packet may be passed on to higher level networking components in a computing device. Conversely, if a received transmission attempt of the packet does not pass error checking, or passes with a reliability below a threshold, that transmission attempt may be combined with one or more previously or subsequently received transmission attempts for the same packet. Any number of transmission attempts of the packet may be combined in this way to determine a value for each bit in the packet that is regarded as reliable.

In one aspect, the invention relates to a method of operating a computing device to receive packets and provide received packets to a network component. The method includes with a network interface circuit, receiving a first packet. Error checking is performed on the first packet. The error checking is adapted to identify whether a packet that passes error checking and is reliable, a packet that passes error checking and is unreliable or a packet that fails error checking. When the error checking indicates that the first packet has passed error checking, at least a portion of the first packet is provided to the network component. When the error checking indicates that the first packet passes error checking and is unreliable or fails error checking, at least one second received packet is combined with the first packet to form a combined packet. At least a portion of the combined packet is provided to the network component.

In another aspect, the invention relates to a wireless receiving device that has a wireless network interface for receiving transmission attempts of a packet. The device also includes an error checking component that applies nested error control codes comprising at least an inner error control code and an outer error control code to a received transmission attempt of a packet to determine whether the received transmission attempt of the packet passes or fails based on the inner error control code and a degree of reliability based on the inner error control code. The device further includes computer storage medium for storing information representing attempts to transmit the packet. A network stack can provide data from received packets to application level components executing on the wireless receiving device. A packet analyzer can, in response to a received transmission attempt of a packet received by the wireless network interface, selectively store the received transmission attempt in the computer storage medium or provide packet data to the network stack. The packet analyzer selectively provides packets to the network stack by: when the received transmission attempt of the packet is determined by the error checking component to pass with a degree of reliability above a first threshold, providing the received transmission attempt of the packet to the network stack. When the received transmission attempt of the packet is determined by the error checking component to pass with a degree of reliability below the threshold and when the received transmission attempt of the packet is determined by the error checking component to fail, different processing may be performed. That processing may include, when received information representing a prior transmission attempt of the packet is stored in the computer storage medium, forming a combined packet based on the received transmission attempt of the packet and the stored received information and selectively providing the combined packet to the network stack when the combined packet passes based on the outer error checking code and has a degree of reliability based on the inner error correcting code above a second threshold. Though, when received information representing a prior attempt to transmit the received packet is not stored in the computer storage medium, selectively providing includes storing an indication of the received transmission attempt of the packet in the computer storage medium.

In yet a further aspect, the invention relates to at least one non-transitory computer storage medium comprising computer-executable instructions that, when executed, perform a method that includes receiving error checking information on a first transmission attempt of a packet. The error checking information identifies whether the first transmission attempt of the packet passed error checking and is reliable, passed error checking and is unreliable or failed error checking. When the error checking indicates that the first transmission attempt of the packet has passed error checking, at least a portion of the first transmission attempt of the packet is provided to a network stack. When the error checking indicates that the first transmission attempt of the packet passed error checking and is unreliable or failed error checking, combining at least the first transmission attempt of the packet and a second transmission attempt of the packet to form a combined packet, and providing at least a portion of the combined packet to the network stack.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A is a sketch of an environment in which embodiments of the invention may operate;

FIG. 1B is a functional block diagram of a transmitting device of FIG. 1A;

FIG. 1C is a functional block diagram of a receiving device of FIG. 1A;

DETAILED DESCRIPTION

Figure 2:
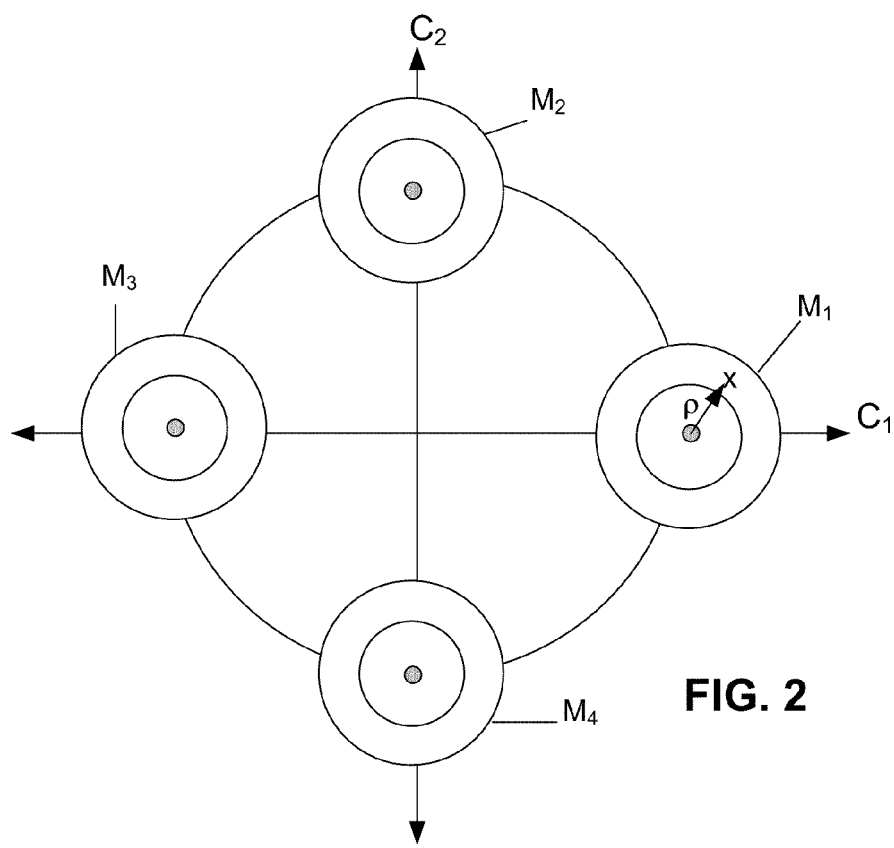
FIG. 2 is a sketch depicting signal transmission parameters useful in understanding a forward error correction code that may be employed in some embodiments of the invention.

The inventors have recognized and appreciated that a desirable tradeoff between speed and reliability of communication can be achieved by combining information from multiple transmission attempts of a packet. The transmission attempts may include those that failed error checking as well as those that passed error checking, but with low reliability.

FIG. 1A illustrates an environment in which embodiments of the invention may be employed. FIG. 1A illustrates two computing devices, computing device 110A and 110B. In this example, computing device 110A is acting as a transmitting device and computing device 110B is acting as a receiving device. Computing device 110A is attempting to transmit a packet of data wirelessly over channel 120 to computing device 110B. Though, it should be appreciated that, in many systems, devices will, at different times, transmit and receive information. Thus, any device may be a transmitting device, a receiving device or both. Though, for simplicity of illustration, only transmission from computing device 110A that are received at computing device 110B are described.

In the embodiment illustrated in FIG. 1A, computing devices 110A and 110B are both portable electronic devices. In the specific example, computing devices 110A and 110B are both illustrated as laptop computers. However, it should be appreciated that computing devices 110A and 110B may be any suitable computing devices, including fixed devices. As an example of a possible variation, one of computing device 110A or 110B could be an access point for a wireless network.

Regardless of the nature of computing devices 110A and 110B, it may be desirable for communications between computing devices 110A and 110B to occur quickly and reliably. In accordance with some embodiments, a desirable balance of speed and reliability for a transmission from computing device 110A to computing device 110B is achieved by combining information received at computing device 110B during multiple transmission attempts of the packet.

FIG. 1B illustrates components within computing device 110A that may be involved in transmission of a packet of data from computing device 110A. In some embodiments, the components within computing device 110A transmitting a packet may be components as are known in the art. In some embodiments, a computing device using novel techniques to receive packets may operate with a conventional device transmitting packets.

Though as described below, in some embodiments the components involved in transmitting may be modified for improved transmission properties. In embodiments in which the components in computing device 110A transmitting a packet are components as are known in the art, those components may operate according to a known communication standard, such as 802.11(b) or 802.11(g) or 802.11(n). In embodiments in which the components are modified as described herein, those components may nonetheless be constructed using techniques as are known in the art.

In the example of FIG. 1B, application 130 generates data to be transmitted from computing device 110A to computing device 110B. Application 130 may be a software program executing, as is known in the art, on computing device 110A. However, the nature of application 130 and the nature of data generated by application 130 for transmission to computing device 110B is not critical to the invention.

Regardless of the nature of application 130, the data generated by application 130 may be passed to a network component, here illustrated as network stack 132. Network stack 132 may be a network stack as is contained in an operating system (not shown) on computing device 110A as is known in the art. Network stack 132 provides an interface between applications, such as application 130, and other components within computing device 110A that manage transmission of data over communication channel 120.

Network stack 132 may process data generated by application 130 in accordance with one or more protocol layers. For example, it is known in the art to use a transmission control protocol (TCP) and an Internet protocol (IP) in connection with transmission of information between two computing devices. Accordingly, network stack 132 may format data generated by application 130 in accordance with the TCP/IP protocols. This formatting may include adding packet headers or other overhead information used in routing data, generated by application 130, to an intended destination.

However, the specific formatting of information performed within network stack 132 is not critical to the invention. The result of processing within network stack 132 may be a bit stream 134 representing a packet to be transmitted. Though denominated a bit stream, bit stream 134 may include groups of bits representing data elements, such as bytes or words. Accordingly, it should be appreciated that the specific formatting of data within bit stream 134 is not critical to the invention.

In the example of FIG. 1B, bit stream 134 is applied to an encoding segment 135. Within encoding segment 135, one or more error control codes are applied. In this example, nested error control codes are used. Though more than two error control codes may be nested, two are illustrated in FIG. 1, with a first error control code used as an inner error control code and a second error control code being used as an outer error control code. As a specific example, a cyclic redundancy check (CRC) is an example of an inner nested error control code. Forward error correction (FEC) is used as an example of an outer error correcting code.

Regardless of the specific error control codes applied, the output of encoding segment 135 is applied to a transmitter for transmission over communication channel 120. In the example of FIG. 1B, the transmitter is contained within a network interface card (NIC) 146. Accordingly, FIG. 1B illustrates a transmit signal 144 output by encoding segment 135 being applied to NIC 146. Though, it should be appreciated that the physical components used for transmitting a packet may be incorporated in any suitable hardware element and may be packaged in any suitable way.

Within encoding segment 135, one or more operations may be performed on bit stream 134 to prepare it for transmission. In the embodiment illustrated, encoding segment 135 includes components 140 and 142.

Component 140 is an example of a component that may apply an inner error control code. In this example, component 140 computes a cyclic redundancy check (CRC). The CRC may be computed in a known way. As one example, the CRC may be computed by adding bytes, words or other groups of bits in bit stream 134. The sum may be expressed as a negative value and appended to the encoded bit stream. As a result, when the bit stream is processed at receiving computing device 110B, if the same computation is performed on the received bits, including the CRC, the sum should be zero if no errors occurred during transmission. Though, the CRC may be computed in any suitable way and, alternatively or additionally, other codes that can detect or detect and correct errors may be used.

Regardless of how the CRC is computed, the bit stream 134 with the CRC is passed to component 142. Component 142 applies forward error correction encoding to the bit stream. The encoded bit stream is then passed on for transmission.

In this example, component 142 encodes bit stream 134, including the CRC, as a stream of symbols. The encoding performed by component 142 may incorporate redundancy into the representation of bit stream 134 that enables a receiving device to detect and correct for errors. For example, component 142 may encode an input bit stream by mapping groups of two bits in the bit stream into symbols, each of which is represented by four bits. The mapping between bits in the input bit stream and symbols may be such that even if errors change one or more of the bits in the symbol, it is possible to identify a likely bit pattern that was encoded into the symbol.

Any suitable encoding scheme may be used by component 142. In the example in which groups of two bits of an input bit stream are mapped to symbols having four bits, there are two redundant bits in each symbol. Such an encoding is said to have a coding rate of one-half, indicating that half of the bits per symbol are used to convey information and half are redundant and are included to allow for detection and correction of errors.

Component 142 may use an encoding scheme that provides any suitable coding rate. In some embodiments, component 142 may use the same coding rate for all transmission attempts of a packet. However, in some embodiments, component 142 may decrease the coding rate for subsequent retransmissions of a packet. The coding rate may be changed, for example, by changing the mapping between groups of bits in the input bit stream and the symbols used to represent each group.

Though, it is not a requirement that component 142 incorporate redundancy into the encoding of a bit stream on a symbol-by-symbol basis. As an example of one alternative, component 142 may insert one or more redundant bits for each of multiple symbols generated by component 142. Adding redundant bits in this fashion also lowers the coding rate, which increases the likelihood that a transmission attempt of a packet will be reliably received. In embodiments, as described below, in which the coding rate is dynamically adjusted, component 142 may use any suitable technique, whether now known or hereafter developed, to adjust the coding rate. If the coding rate is adjusted, information in a packet header, or communicated in any other suitable way to computing device 110B, allows computing device 110B to identify and use the redundant bits to process a received transmission attempt.

FIG. 1C illustrates components that perform processing within computing device 110B upon receipt of a transmission attempt of a packet. In the example of FIG. 1C, the packet is received by a receiver within a network interface card (NIC) 150. NIC 150 provides a received signal 152 to a decoding segment 153. Decoding segment 153 may perform operations that are the inverse of those performed by encoding segment 135 to recover a bit stream 174. The recovered bit stream can then be provided to a network stack 176. Network stack 176 may direct the bit stream 174, representing a received packet, to an appropriate component within computing device 110B. In the embodiment illustrated, the destination of the packet is application 178, which may be an application as is known in the art executing on computing device 110B. However, the destination of a received packet within computing device 110B is not a limitation on the invention.

Within decoding segment 153, the received signal 152 is passed to components 154 and 156. These components successively apply error control codes in a nested fashion. In this example, the same error control codes used in encoding segment 135 are also applied in decoding segment 153, but in the reverse order and in a complementary fashion. Rather than using the error control codes to encode information, they are applied to decode the information that was encoded before transmission. Accordingly, received signal 152, representing a transmission attempt of a packet, is applied to component 154 that applies an FEC code to recover groups of bits from the received signal 152. If no errors occurred in transmission of a packet attempt, or any errors that occurred could be corrected by the FEC code, the output of component 154 should contain recovered bits accurately representing bit stream 134 that was to be transmitted. Though, if the errors that occurred overwhelmed the FEC code, the recovered bit stream may not be an accurate representation of the packet that was transmitted.

The inner error control code may be used to determine whether the recovered bits accurately represent the transmitted bits. Though, in some scenarios, the inner error control code may also be overwhelmed such that, even if the inner code indicates that a transmission attempt of a packet was received with no errors, there may in fact be errors.

In the embodiment illustrated, CRC is used as the inner error control code. In this embodiment, the recovered bits output by component 154 are applied to component 156 that performs a cyclic redundancy check. Component 156 may perform a cyclic redundancy check as is known in the art.

In a conventional receiving device, if the cyclical redundancy check indicates that the decoded bit stream contains no errors, the bit stream is provided to a network stack, such as network stack 176. In response to passing the CRC, the network interface hardware may also be triggered to generate an ACK message to the sender. Conversely, if the cyclic redundancy check indicates that the transmission attempt of the packet was received with one or more errors, even after processing within FEC decode component 154, the received transmission attempt may be discarded and a notification may be sent to a network interface component, such as NIC 150, to await receipt of a further transmission attempt and, in some protocols, to send a NAK to prompt the sending device to retransmit the packet.

However, in the embodiment illustrated in FIG. 1C, additional processing is performed to determine whether to send an ACK or a NAK, if receiving device 110B is communicating according to a protocol that uses a NAK. In the embodiment, illustrated, that additional processing is performed within packet analyzer 170. Accordingly, the results of the cyclical redundancy check performed by component 156 are provided to a packet analyzer 170. Packet analyzer 170 also receives the decoded bits 162. In addition, packet analyzer 170 receives information from FEC decode component 154, indicating the reliability of the information received for the transmission attempt.

Based on this information, packet analyzer 170 may determine that the bits received for the transmission attempt are a reliable representation of transmitted data and pass the decoded bits to network stack 176 as bit stream 174. In other scenarios, packet analyzer 170 may deem the decoded bits to be unreliable and perform processing to improve the reliability of the bit stream and then provide a bit stream to network stack 176. In yet other scenarios, packet analyzer 170 may determine that it lacks adequate data to reliably provide data to network stack 176. In that case, packet analyzer may store the decoded bits 162 for processing later in connection with subsequently received transmission attempts of the packet.

Based on the disposition of the received transmission attempt, packet analyzer 170 may trigger sending of an ACK or, in embodiments using protocols that include a NAK, sending of a NAK. An ACK may be sent if data is provided to network stack 176 as a result of a received transmission attempt of a packet and a NAK may be sent if further processing, based on subsequently received transmission attempts, may be used to generate data to pass to stack 176.

In the embodiment illustrated, packet analyzer 170 determines, for each received transmission attempt, whether it has sufficient information to reliably determine the contents of bit stream 174 to be provided to network stack 176. Packet analyzer 170 may generate the reliable information by combining a received transmission attempt of a packet with information representing a previously received transmission attempt of the packet. In this example, information characterizing a previously received transmission attempt may be stored in packet store 172. In scenarios in which packet store 172 does not contain adequate information from prior transmission attempts to reliably determine the contents of bit stream 174, packet analyzer 170 may store a received transmission attempt in packet store 172 for use when a subsequent transmission attempt of that packet is received.

In the embodiment illustrated, the processing in packet analyzer 170 is based both on an indication of whether a received transmission attempt passes error checking, as indicated by component 156, and a reliability of the received data as indicated by component 154. FIG. 2 illustrates an approach that may be used to determine reliability of received data. Though, it should be appreciated that FIG. 2 is illustrative rather than limiting, and any suitable technique for determining reliability of received data may be used.

FIG. 2 depicts analog signal characteristics used to represent symbols in channel 120. In the example illustrated the characteristics are shown generally as $C_1$ and $C_2$. These analog characteristics, for example, may be signal amplitude and signal phase or signal frequency and signal amplitude. However, the specific characteristics are not critical and any characteristics that can be modulated by NIC 146 and detected by NIC 150 may be used. In the example illustrated, four regions $M_1$, $M_2$, $M_3$ and $M_4$ are illustrated. Each of these corresponds to a symbol representing a specific pattern of bits. To transmit a bit pattern, NIC 146 generates a signal with characteristics corresponding to the pattern of bits.

In the embodiment illustrated, NIC 146 may transmit a signal with characteristics indicated to be at the center of one of the four regions $M_1$, $M_2$, $M_3$ and $M_4$. Though, as the transmitted signal propagates through channel 120, noise may distort the signal characteristics. For this reason, NIC 150 will associate any signal with characteristics anywhere within a region to be associated with that region. Though, signals received with characteristics further from the center of a region indicate that there was likely more error introduced in channel 120 than when signals are received with characteristics at or near the center of the region. FIG. 2 shows with an X the signal characteristics received and an error, $\rho$. That error can be taken as an indication of the reliability of the received data, with smaller values of $\rho$ indicating more reliable data.

FIG. 2 illustrates an embodiment in which a measure of reliability is determined based on characteristics of a received analog signal, which may be provided by NIC 150. An analogous approach may also be based on digital information in a received signal. A digital approach may be based on a coding scheme in which there are redundant patterns of bits used to represent a single symbol. For example, a symbol may be represented by a bit pattern (0,0,0). Similar bit patterns may be unused for representing any transmitted symbol, but may be associated with the bit pattern (0,0,0). Bit patterns (0,0,1), (0,1,0) and (1,0,0) may all be associated with the same symbol as the bit pattern (0,0,0). If any of the bit patterns (0,0,1), (0,1,0) and (1,0,0) is received, it is clear that one or more errors occurred, even though the received bit pattern can be mapped to a transmitted symbol. The number of bits different between the pattern detected and the pattern used to represent a symbol upon transmission may also be a measure of error. More generally, the coding distance between a received bit pattern and nominal bit pattern to represent a signal may be taken as a measure of error or, conversely, as a measure of the reliability of the data received.

Figure 3:
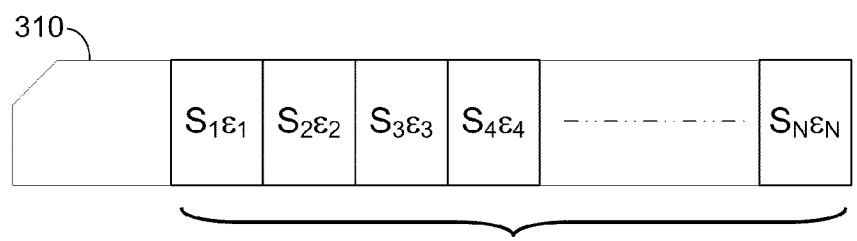
FIG. 3 is a sketch conceptually illustrating a received transmission attempt of a packet.

FIG. 3 illustrates data that may be generated for a received transmission attempt for a packet. Packet 310 is shown to consist of a series of received symbols and associated reliability information. Here, the symbols are represented as $S_1$, $S_2 \ldots S_N$. The reliability associated with each is indicated as $\epsilon_1, \epsilon_2, \ldots \epsilon_N$. The reliability values may be determined as the reciprocal of the error or in any other suitable way.

Regardless of the manner in which reliability information is generated, it may be used within packet analyzer 170 to determine subsequent processing steps for a received transmission attempt. In some embodiments, an overall reliability for a received transmission attempt for a packet may be determined. This overall value may then be compared to a threshold value or otherwise used to determine whether a received transmission attempt is reliable. In some embodiments, the reliability values $\epsilon E_1, \epsilon_2, \ldots \epsilon_N$ associated with each of the symbols may be aggregated, such as by summing the reliability values, averaging the reliability values across all received symbols or counting the number of symbols for which an individual reliability value is below a threshold. The specific thresholds to determine reliability may be determined in any suitable way, and, for example, may be based on computation or empirical measurements.

Regardless of how reliability is determined for a received transmission attempt, it may be used to determine whether a received transmission attempt is sufficiently reliable to forward to network stack 176 or if further processing, in conjunction with previously received or subsequently received transmission attempts for the same packet, is warranted to improve reliability.

In the illustrated embodiment, a transmission attempt of a packet is forwarded to network stack 176 only if at least two criteria are met. That transmission attempt must pass error checking provided by all error control codes and must have a reliability above a threshold. Otherwise, the packet is routed for further processing to increase the reliability of data provided to network stack 176. The inventors have recognized and appreciated that some communication errors may occur in bursts such that sufficient errors may occur for a transmission attempt that the errors may simultaneously overwhelm error control codes, such as FEC and CRC. Accordingly, even though CRC indicates that a transmission attempt was accurately decoded, the received transmission attempt may actually contain errors. Accordingly, conditioning processing of received transmission attempts, even those that pass error checking, on the reliability of receipt improves communications.

Figure 4:
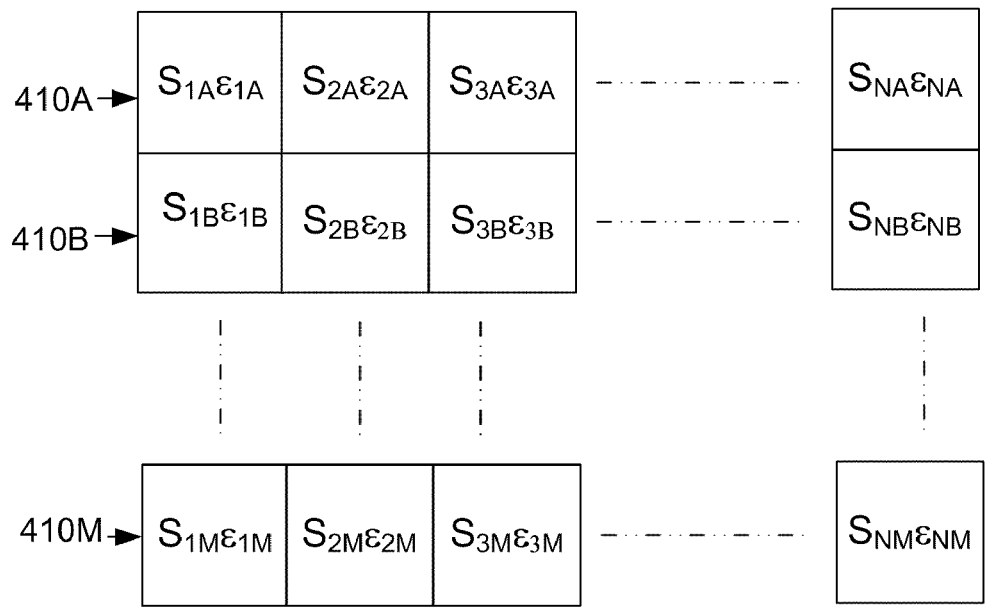
FIG. 4 is a sketch of a data structure storing multiple received transmission attempts of a packet according to some embodiments.

Further processing on received transmission attempts may be based on information representing received transmission attempts stored in packet store 172 (FIG. 1) in combination with a newly received transmission attempt. FIG. 4 illustrates an example of data in packet store 172, representing previously received transmission attempts, in combination with a newly received transmission of a packet. As illustrated, packet analyzer 170 may have access to data on multiple transmission attempts, here represented as data sets 410A . . . 410M, representing each of M received transmission attempts. In the example illustrated, the data on each transmission attempt includes values for each of N symbols that may be part of the packet. Accordingly, each data set is shown to have N portions, each representing a symbol and a reliability associated with that symbol.

Reliable data representing a received packet may, in some scenarios, be derived by processing these data sets together. The data may be processed to select, on a symbol by symbol basis, reliable symbols that collectively form a combined packet. Though, any suitable processing may be used to form a combined packet. In the embodiment illustrated, each of the data sets 410A . . . 410M contains a value for each symbol in the packet. One approach to forming a combined packet is to select, for each symbol in the received transmission attempts of the packet, the corresponding symbol from the data sets 410A . . . 410M that is most reliable. As an example, across the data sets 410A . . . 410M, there are multiple possible values for the first symbol, indicated as $S_{1A}, S_{1B} \ldots S_{1M}$. One of these values may be selected based on an associated reliability, $\epsilon_{1A}, \epsilon_{1B} \ldots \epsilon_{1M}$, respectively, that is highest. For example, if $\epsilon_{1B}$ is the highest reliability, $S_{1B}$ may be selected as the first symbol. Other symbols in the combined packet may be similarly selected from the data structure illustrated in FIG. 4.

Figure 5:
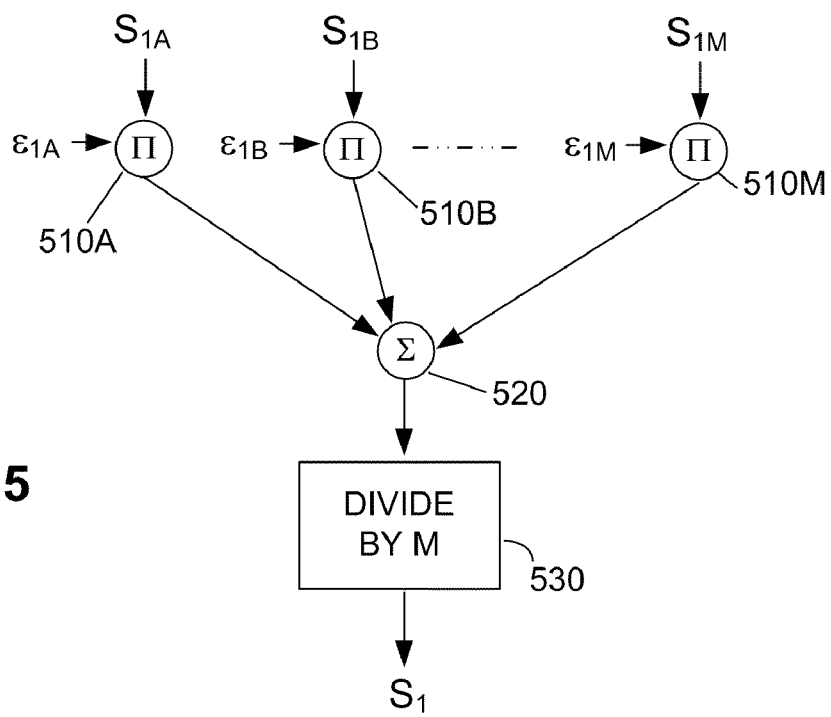
FIG. 5 is a functional block diagram of components for combining portions of multiple transmission attempts of a packet.

Though, any suitable approach may be used to combine data sets representing multiple received transmission attempts. As an example, of an alternative approach, symbols in the combined packet may be computed. FIG. 5 illustrates an embodiment in which an average of corresponding symbols in the data sets 410A . . . 410M is computed and the average of each symbol is used as the corresponding symbol in the combined packet. The average may be computed as a weighted average, with each symbol in a received transmission attempt being weighted by the reliability of that symbol.

FIG. 5 illustrates processing that may be performed in hardware or software components. FIG. 5 illustrates the processing to compute one symbol in a combined packet. The illustrated processing may be performed for each symbol in the combined packet. As shown, corresponding symbols $S_{1A}$, $S_{1B} \ldots S_{1M}$ in each of M received transmission attempts and the reliabilities $\epsilon_{1A}, \epsilon_{1B} \ldots \epsilon_{1M}$ associated with those symbols are taken as inputs. Each symbol is weighted by its reliability in multipliers 510A, 510B ... 510M. The weighted symbol values are summed in adder 520 and then normalized in a divider 530, which divides by M.

Though, it should be appreciated that FIG. 5 is illustrative and not limiting of approaches for forming a combined packet. For example, the most frequent symbol value may be selected or a symbol value may be selected in any other suitable way.

In conjunction with selecting a value for each symbol in a combined packet, a corresponding reliability may be determined. The reliability may be computed in any suitable way. The reliability could, for example, be an average of the reliabilities associated with symbols combined into the combined symbol. Though, the reliability may be computed or estimated based on the value of the selected symbol and the values of the corresponding symbols in the data sets representing received transmission attempts and their associated reliabilities. Such a value could be computed as a conditional probability given multiple observations. As one example, the following conditional probability equitation could be used to represent the reliability of the combined packet:

$$\epsilon_1 = P(S_1 | S_{1A}, S_{1B}, \ldots S_{1M}, \epsilon_{1A}, \epsilon_{1B} \ldots \epsilon_{1M}) \qquad \text{EQ. (1)}$$

Such a conditional probability may be computed using techniques as are known in the art. Though, a reliability of a combined packet may be determined in any other suitable way.

Regardless of how it is computed, the reliability of the combined packet may be used to determine whether the combined packet is a reliable representation of a packet such that the data in the combined packet is to be passed to network stack 176 or other network component for further processing. The combined packet may be deemed reliable when the computed reliability exceeds a threshold and/or the combined packet passes a CRC error check.

If the combined packet is deemed reliable and is passed to network stack 176, packet store 172 may be erased. In this way, packet store 172 contains at any one time only data representing transmission attempts of the same packet.

Figure 6:
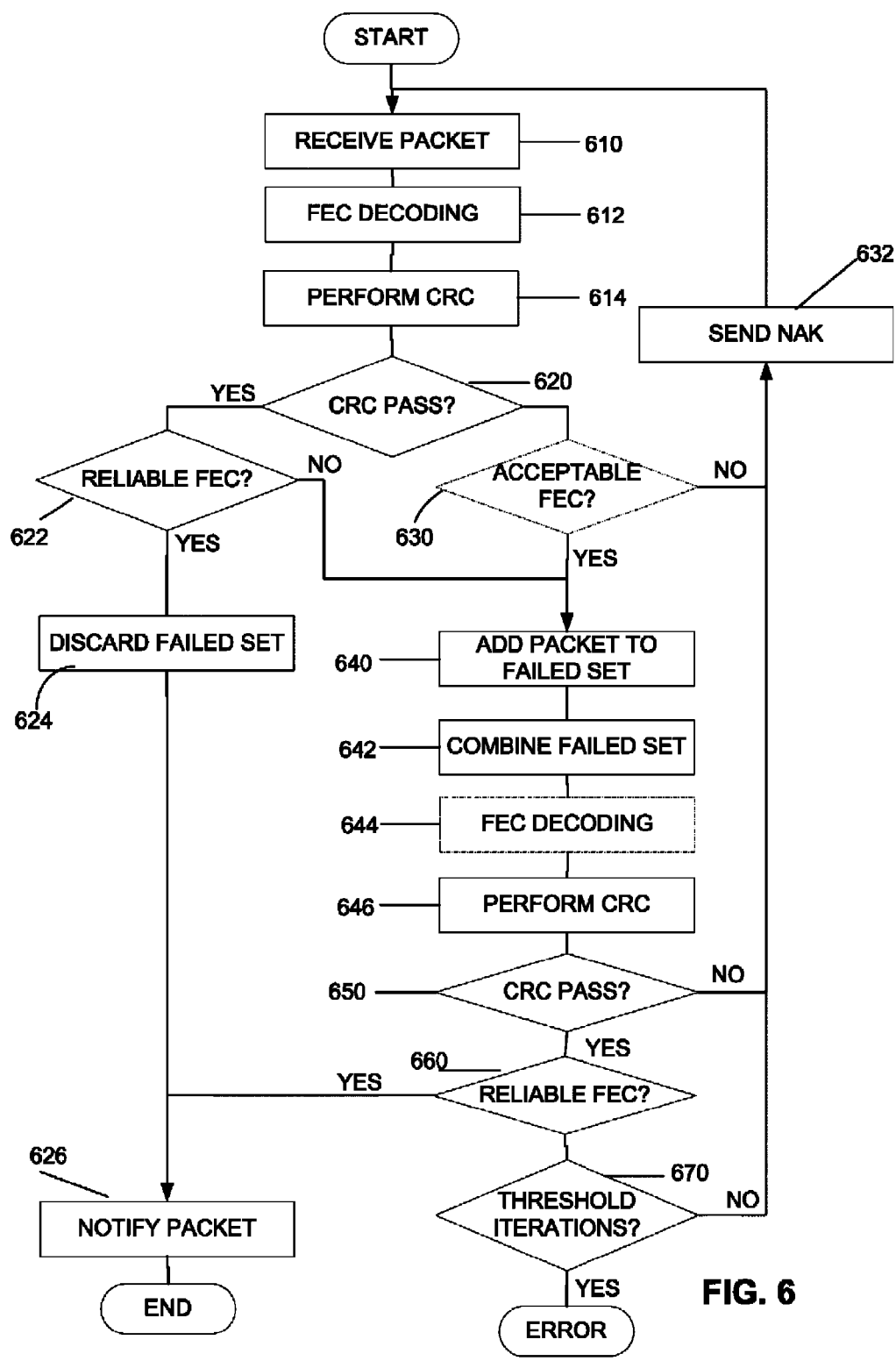
FIG. 6 is a flow chart illustrating a method of processing multiple transmission attempts of a packet.

FIG. 6 is a flow chart of a method of operating a receiving device, such as computing device 110B (FIG. 1A), to from a combined packet. The method of FIG. 6 begins at block 610 where the receiving device receives data, representing a transmission attempt of a packet. That data may be received using hardware as is known in the art or in any other suitable way.

At block 612, an outer error control code may be applied to the data received at block 610. In the embodiment illustrated, the outer error control code is an FEC code. Accordingly, at block 612, FEC decoding is performed. This decoding may be performed in hardware or software elements using techniques known in the art or in any other suitable way.

Following application of the outer most error control code, one or more inner error control codes may be applied. In the embodiment illustrated in FIG. 6, two, nested error control codes are used. Accordingly, at block 614 an inner error control code is applied. In this example, the inner error control code is a CRC code. Accordingly, at block 614, a CRC computation is performed.

At decision block 620, the process branches depending on the results of the CRC computation performed at block 614. If the computation performed at block 614 indicates that the data received at block 610 passes the CRC check, the process branches to decision block 622. At decision block 622, the process again branches depending on whether the data received at block 610 has been deemed reliable. In some embodiments, data may be deemed reliable based on the number and nature of errors detected by application of the FEC code. However, any suitable mechanism for determining reliability may be employed.

If the data is deemed reliable, the process branches to block 624. At block 624, cached data, representing previously received transmission attempts of the same packet may be discarded. In the embodiment of FIG. 1C, processing at block 624 may involve clearing packet store 172.

The process of FIG. 6 then proceeds to block 626 where the packet is notified. As is known in the art, a received packet is "notified" when data associated with the packet is stored in memory accessible to operating system components that further process the packet and deliver it to a user mode component or application executing on a computing device and designated as the destination for the packet. Though it should be appreciated that the results of processing at block 626 is that the packet is available to the destination identified in the packet, and any suitable mechanism for making the packet available for the destination may be used.

Conversely, if the CRC check performed at block 614 fails, indicating that one or more errors exist in the received transmission attempt that could not be corrected by the FEC code, the process of FIG. 6 branches from decision block 620 to other processing blocks in which failed packets may be processed. In the example illustrated, processing branches from decision block 620 to decision block 630. At decision block 630, a check may be performed to determine whether the reliability metrics associated with the received packet are acceptable. Processing at decision block 630 may identify a received transmission attempt that is so unreliable that it is not used in further processing. Accordingly, the processing at decision block 630 may involve comparing reliability metrics generated as a result of FEC decoding to a threshold value that is lower than the threshold applied at decision block 622.

If the received transmission attempt is determined to be unacceptable for further processing, the data representing the received transmission attempt may be discarded and the process may branch to block 632. At block 632, the receiving device may generate a NAK, indicating that the receiving transmission attempt for the packet did not result in reliable reception. As in known protocols, sending a NAK at block 632 may trigger the sending device to make a further attempt to transmit the packet. Accordingly, the process loops back from block 632 to block 610, where further transmission attempts may be received.

Conversely, if processing at decision block 630 deems that the received data representing a transmission attempt of a packet is acceptable for use in further processing even if not sufficient to be passed on to network components as a reliable representation of a received packet, the process may continue to block 640. At block 640, the data received at block, 610 may be added to a data set presenting received transmission attempts of a packet.

At block 642, the data set representing transmission attempts of a packet may be combined. As described above, the attempts may be combined on a symbol by symbol basis or may be applied on a bit by bit basis or in any other suitable way.

The combined packet produced at block 642 may then be further processed to determine whether it reliably represents the packet. This processing may entail processing to determine both whether the combined packet appears to contain errors and whether the underlying data appears reliable. In the embodiment illustrated in FIG. 6, this processing begins at block 644 in which FEC decoding is performed on bits of the combined packet. In this block, errors may be corrected as a result of application of the FEC code. Additionally, a measure of the reliability of the decoding performed at block 644 may be generated. The decoding performed at block 644 may use the same mechanisms as are used at block 612 to correct errors and develop and indication of the reliability of the bits output as a result of FEC decoding.

At block 646, a CRC code may be applied to the bits output by FEC decoding at block 644. Processing at block 646 may use techniques similar to those performed at block 614. Though, processing at block 650 may use any suitable techniques to determine whether the combined packet generated at block 642 appears to contain errors. The process of FIG. 6 branches at decision block 650 depending on whether the error checking block 646 indicates errors in the combined packet. If the combined packet does not pass error checking based on the CRC code, the process branches to block 632. At block 632, a NAK is sent and the process loops back to block 610, where a further retransmission attempt may be received.

Conversely, if the combined packet passes error checking, the process may branch from decision block 650 to decision block 660. At decision block 660, the process may again branch. Branching at decision block 660 may be based on the reliability of the combined packet. In this embodiment, the reliability of the combined packet may be based on information relating to the likelihood of errors in the received packet as determined by FEC decoding at block 644. However, any suitable mechanism may be used to determine whether the combined packet is reliable. If the combined packet both passes error checking and is deemed to be reliable data, the process branches from decision block 660 to block 626. At block 626, as described above, the packet is notified to a networking component that routes a received packet to its destination. However, when processing reaches block 626 through decision block 660, rather than the packet received at block 610 being notified, the combined packet, generated by processing at block 642, is notified.

The processing as illustrated in FIG. 6 may be repeated iteratively on successive received transmission attempts. Though, there may be limits on the number of iterations performed. If the combined packet is not deemed reliable, processing may branch from decision block 660 to decision block 670. At decision block 670 the process may again branch. Branching at decision block 670 is based on the number of received transmission attempts that have been processed. If the number of received transmission attempts is below a threshold, the process may loop back through block 632 to block 610. Conversely, if the number of iterations through the processing illustrated in FIG. 6 exceeds a maximum number of iterations, processing may terminate in an error condition. A determination of whether the number of iterations has exceeded a threshold may be made in any suitable way. The determination may be made based on processing solely on the receiving device. Though, in some embodiments, processing on the transmitting device may alternatively or additionally identify whether an error condition has occurred.

Any suitable processing may be performed in response to detecting an error condition. In some embodiments, an error in receipt of a packet may be indicated to a networking component, allowing the error to be addressed at higher protocol levels. Also, as part of error processing, data structures associated with attempts to receive a packet may be reset. Those data structures may include packets store 172 (FIG. 1C).

The processing illustrated in blocks 640, 642, 644, 646, 650, 660 and 670, may also be performed in response to a determination that, though a received transmission attempt has passed CRC error checking, the received data is unreliable. Accordingly, FIG. 6 illustrates that upon determination that data representing a received packet is unreliable, the process may branch from decision block 622 to decision block 630.

It should be appreciated that FIG. 6 illustrates just one possible process that may be used on a receiving device. Some or all of the processing illustrated in FIG. 6 may be omitted or other variations may be made. For example, the processing illustrated in FIG. 6 corresponds to an embodiment in which a protocol specifying that a NAK is sent when a transmission attempt is received but is not deemed sufficiently reliable to provide data from the packet to a destination component. In embodiments in which no NAK is sent, processing at block 632 may be omitted. Similarly, processing at block 630 may be omitted in embodiments in which a combined packet is formed by weighted combinations of received transmission attempts. Weighting received transmission attempts in proportion to their reliability may achieve the same results as discarding received transmission attempts with very low reliability. Also, it should be recognized that processing at block 644 may not be present in embodiments in which received transmission attempts are combined on a symbol by symbol basis.

Figure 7:
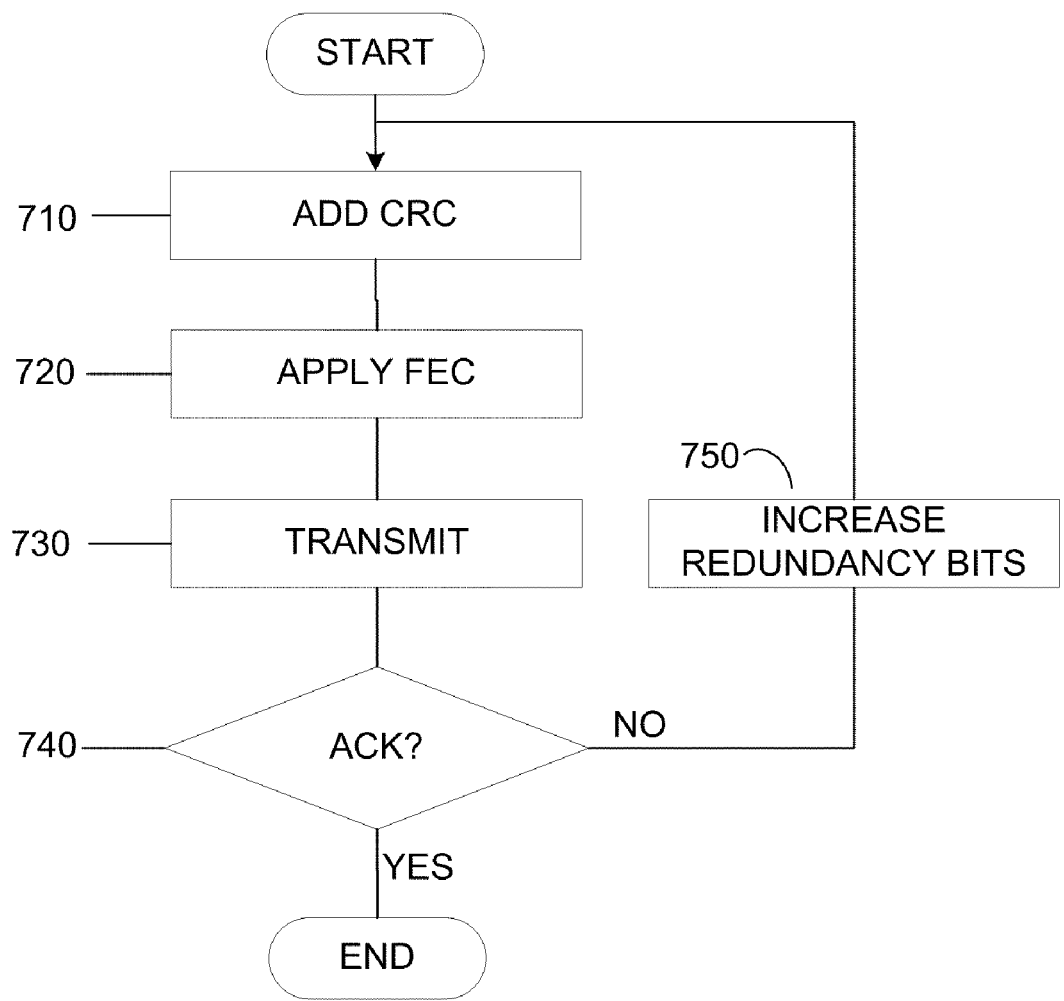
FIG. 7 is a flow chart of a method of operating a transmitting device according to some embodiments of the invention.

FIG. 7 illustrates processing that may be performed on a transmitting device. The processing illustrated in FIG. 7 is performed in an embodiment in which a transmitting device and receiving device communicate according to a protocol that does not require sending a NAK when a received transmission attempt does not allow reliable determination of the data in a packet. Though, it should be appreciated that similar processing may also be performed in an embodiment in which a NAK is received. The processing described to occur when no ACK is received could alternatively or additionally occur in response to receiving a NAK.

The processing of FIG. 7 illustrates transmission of a packet. The processing of FIG. 7 may begin in response to generation of data to be transmitted in a packet. The data may be generated by an application or other components. Though, the source of data to be transmitted is not a limitation on the invention.

Regardless of the source of data, processing may begin at block 710 where a CRC is performed on the data. The CRC value may be added to the data to be transmitted.

At block 720, FEC code may be applied to the data, including the appended CRC value. At block 730, the data, as encoded using the FEC code and the CRC code, may then be transmitted. Though, in some embodiments, an initial transmission attempt may entail transmission of only a portion of the bits of a packet as encoded with an FEC code. As is known in the art, encoding data with an FEC code results in redundant bits in the encoded data. Stronger codes have more redundant bits, allowing a larger number of errors to be corrected by a receiving device. If a strong FEC code is used to encode a packet, all of the redundant bits may be necessary to reliably receive the packet and correct for errors when channel conditions are favorable for transmission.

In some embodiments in which a receiving device stores an unreliable received transmission attempt for use in constructing a reliable combined packet, it may be possible to initially send a portion of the redundancy bits that could be generated by a strong FEC code. If additional redundancy bits are required to reliably receive the packet based on channel conditions at the time, a successive transmission attempt may convey the additional redundancy bits. Accordingly, the initial transmission attempt may be at a higher coding rate (fewer redundant bits) than can be generated by processing at block 720. In some embodiments, the higher coding rate may be achieved by initially generating all the redundancy bits associated with a packet, but storing, without initially transmitting, a portion of those redundancy bits. Though, in another embodiment, initial processing at block 720 may entail encoding the packet at a first coding rate with processing at block 720 for subsequent transmission attempts encoding the packet at a second, lower, coding rate so that more redundant bits are available. Though, regardless of how and when the redundant bits are generated, in an initial attempt, the packet may be sent with only a subset of the possible redundant bits.

At decision block 740, the process may branch, depending on whether an ACK is received. If an ACK is received in response to the transmission, the packet may be deemed to have been reliably transmitted. Accordingly, the process may end when the ACK is received.

Conversely, if no ACK is received within an expected time, the process may branch to block 750. At block 750, the encoding of the data representing a transmission attempt may be modified for increased reliability. In the embodiment illustrated, the modification may involve increasing redundancy bits in a transmission attempt of the packet. Redundancy may be increased by decreasing the coding rate used at block 720 or in any other suitable way. As an example of a possible variation, subsequent transmission attempts may involve, rather than retransmitting the full packet, transmitting additional redundant bits. Regardless of the manner in which the additional redundant bits are communicated in subsequent transmission attempts for a packet, the receiving device may use the additional redundant bits to increase the likelihood that the packet is received correctly.

As a specific example, in an embodiment in which a subsequent transmission attempt entails only additional redundant bits the receiving device may add the redundant bits to a previously received transmission attempt stored in packet store 172. The receiving device may then attempt to decode that transmission attempt, including the additional redundancy bits, using an FEC code with a lower encoding rate that matches the total number of redundant bits in the initial transmission attempt plus the additional redundant bits received in the subsequent attempt. Depending on the reliability of the decoding, that transmission attempt may be notified to the network stack or, if the reliability is still below a threshold, store the received transmission attempt in packet store 172 to await a further transmission attempt.

As an alternative, if a retransmission attempt includes the full packet encoded with a lower coding rate, the receiving device may decode the transmission attempt with an FEC having a lower coding rate and, depending on the reliability of the received transmission attempt, notify the packet to the network stack, combine it with previously received transmission attempts or store it for combining with subsequently received transmission attempts. In this embodiment, processing may be performed in accordance with the method of FIG. 6, with the exception that FEC decoding at block 612 performed in different iterations of the process may entail different strength FEC codes.

Regardless of how the additional redundant bits are reflected in subsequent iterations, the process may then loop back to block 710 where a further transmission attempt is made. The process may continue in this fashion until an ACK is received, indicating the packet has been reliably transmitted. Though, a limitation may be imposed on the number of iterations of the process of FIG. 7 that are performed or any other suitable limitation may be applied. Also, a limitation may be imposed on the number of iterations in which additional redundant bits are transmitted. For example, the number of redundant bits may only be increased for a limited number of iterations. As a specific example, the number of redundant bits may only be increased in the second transmission attempt. Subsequent transmission attempts may repeat the full packet, including all the redundant bits previously transmitted.

Having thus described several aspects of at least one embodiment of this invention, it is to be appreciated that various alterations, modifications, and improvements will readily occur to those skilled in the art.

For example, FIG. 4 illustrates that multiple data sets representing successive received transmission attempts of a packet all have the same number of symbols. It should be appreciated that, because of errors, some transmission attempts will be received incomplete, with fewer symbols than others. Any suitable processing may be performed in that case. For example, received transmission attempts with fewer symbols than others may be discarded. Alternatively, a matching process may be used to align received symbols in different received transmission attempts for comparison.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, it should be appreciated that FIGS. 1B and 1C illustrate functional components. A computing device may be implemented with any suitable partitioning of the components illustrated. As a specific example, encoding segment 135 is shown separately from network stack 132 and NIC 146. Though, it should be appreciated that encoding segment 135 may be implemented in software and the functions of encoding segment 135 may be implemented as part of network stack 132. Conversely, the functions of encoding segment 135 may be implemented in hardware as part of NIC 146. Though, other suitable partitions are possible. For example, some of the functions of encoding segment 135 may be implemented in a driver associated with NIC 146 or the functions of encoding segment 135 may be split between network stack 132 and NIC 146. Similarly, the functions of decoding segment 153 may be performed within NIC 150, a driver for NIC 150 or within network stack 176, or may be distributed over these components in any suitable way.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a computing device to receive packets and provide received packets to a network component, the method comprising:
   with a network interface circuit, receiving a first packet comprising a plurality of symbols;
   performing error checking on the first packet, the performing error checking on the first packet further comprising determining a probability of error for each symbol of the plurality of symbols in the first packet, the error checking being adapted to identify:
      a packet that passes the error checking and is reliable,
      a packet that passes the error checking and is unreliable, and
      a packet that fails the error checking;
   when the error checking indicates that the first packet has passed the error checking, providing at least a portion of the first packet to the network component; and
   when the error checking indicates that the first packet passes the error checking and is unreliable or that the first packet fails the error checking:
   receiving at least one second packet comprising a plurality of symbols;
   performing the error checking on the second packet, the performing the error checking on the second packet further comprising determining a probability of error for each symbol of the plurality of symbols in the second packet;
combining at least the first packet and the second packet to form a combined packet, the combining further comprising:
combining corresponding symbols in the at least the first packet and the second packet, the combining corresponding symbols further comprising:
forming a weighted combination of symbols in the first packet and the second packet, the weighted combination being based on weighting each of the symbols in the first packet and the second packet in proportion to the determined probability of error for the symbol; and
providing at least a portion of the combined packet to the network component.

2. The method of claim 1, wherein:
the first packet is encoded with a nested error control code, the nested error control code comprising an inner error control code and an outer error control code;
the error checking indicates that the first packet has failed the error checking based on decoding the first packet using the inner error control code.

3. The method of claim 2, wherein:
the error checking indicates that the first packet is unreliable based on decoding the first packet using the outer error control code.

4. The method of claim 3, wherein:
the method further comprises maintaining in a store indications of packets that pass the error checking and are unreliable or fail error checking.

5. The method of claim 4, further comprising:
when the error checking indicates that the first packet has passed the error checking, resetting the store.

6. The method of claim 1, further comprising:
when the error checking indicates that the first packet passes the error checking and is unreliable, transmitting a NAK.

7. The method of claim 1, wherein a received packet of a transmission attempt has an increased number of redundancy bits with respect to the packet of a previous transmission attempt when an acknowledgement regarding the packet of the previous transmission attempt is not received by a device that attempted to transmit the packet of the previous transmission attempt.

8. The method of claim 1, wherein the first packet is encoded with a nested error control code comprising a cyclic redundancy check of information transmitted and a forward error correction code for detecting and correcting up to a predetermined number of errors in the information transmitted.

9. A wireless receiving device, the device comprising:
a wireless network interface for receiving transmission attempts of a packet;
an error checking component that applies nested error control codes comprising at least an inner error control code and an outer error control code to a received transmission attempt of a packet to determine whether a received transmission attempt of the packet passes or fails based on the inner error control code and a degree of reliability based on the outer error control code;
a computer storage medium for storing information representing attempts to transmit the packet;
a network stack for providing data from received packets to application level components executing on the wireless receiving device;
a packet analyzer for, in response to a received transmission attempt of a packet received by the wireless network interface, selectively storing the received transmission attempt in the computer storage medium or providing packet data to the network stack, the packet analyzer selectively providing packets to the network stack by:
when the received transmission attempt of the packet is determined by the error checking component to pass with a degree of reliability above a first threshold, providing the received transmission attempt of the packet to the network stack; and
when the received transmission attempt of the packet is determined by the error checking component to pass with a degree of reliability below the threshold and when the received transmission attempt of the packet is determined by the error checking component to fail:
when received information representing a prior transmission attempt of the packet is stored in the computer storage medium:
forming a combined packet based on the received transmission attempt of the packet and the stored received information; and
selectively providing the combined packet to the network stack when the combined packet passes based on the outer error checking code and has a degree of reliability based on the inner error correcting code above a second threshold;
when received information representing a prior attempt to transmit the received packet is not stored in the computer storage medium:
storing an indication of the received transmission attempt of the packet in the computer storage medium.

10. The wireless receiving device of claim 9, wherein the error checking component applies a cyclic redundancy check (CRC) as the inner error correcting code.

11. The wireless receiving device of claim 10, wherein the error checking component applies a forward error correcting code as the outer error correcting code.

12. The wireless receiving device of claim 11, wherein:
the error checking component computes a degree of reliability for each of a plurality of symbols comprising a received packet; and
the packet analyzer forms a combined packet by forming weighted combinations of symbols from the received packet and stored information representing prior attempts to transmit the received packet, the weighted combinations being formed based on the degree of reliability for each of the symbols comprising the received packet and reliability information associated with symbols within the stored information representing prior attempts to transmit the received packet.

13. The wireless receiving device of claim 9, wherein the packet analyzer triggers the network interface to send a NAK when the received packet is determined by the error checking component to pass with a degree of reliability below the threshold.

14. The wireless receiving device of claim 9, wherein the error checking component employs nested error detecting codes.

15. The wireless receiving device of claim 9, wherein the wireless network interface, the error checking component and the packet analyzer comprise a unitary component.

16. At least one non-transitory computer storage medium comprising computer-executable instructions that, when executed, perform a method comprising:

receiving error checking information on a first transmission attempt of a packet, the error checking information including a degree of reliability for each of a plurality of symbols received as a result of the first transmission attempt, the error checking information identifying whether the first transmission attempt of the packet:
passed error checking and is reliable,
passed the error checking and is unreliable, or
failed the error checking;
when the error checking indicates that the first transmission attempt of the packet has passed the error checking, providing at least a portion of the first transmission attempt of the packet to a network stack; and
when the error checking indicates that the first transmission attempt of the packet passed the error checking and is unreliable or the first transmission attempt of the packet failed the error checking:
combining at least the first transmission attempt of the packet and stored information representing at least one prior attempt to transmit the packet to form a combined packet, the combining further comprising:
forming weighted combinations of symbols from the packet received as a result of the first transmission attempt and from the stored information representing at least one prior attempt to transmit the packet, the weighted combinations being formed based on a degree of reliability for each of the plurality of symbols of the packet received as the result of the first transmission attempt and reliability information associated with symbols within the stored information representing the at least one prior attempt to transmit the packet; and
providing at least a portion of the combined packet to the network stack.

17. The at least one non-transitory computer storage medium of claim 16, wherein:
the packet of the at least one prior attempt to transmit the packet is received before the first transmission attempt of the packet; and
the method further comprises obtaining the stored information representing the at least one prior attempt to transmit the packet from a computer storage medium.

18. The at least one non-transitory computer storage medium of claim 16, wherein:
the combining at least the first transmission attempt of the packet and stored information representing at least one prior attempt to transmit the packet to form a combined packet comprises combining corresponding symbols in each transmission attempt of the first transmission attempt and the stored information representing the at least one prior attempt to transmit the packet.

19. The at least one non-transitory computer storage medium of claim 18, wherein:
the combining corresponding symbols comprises:
summing corresponding weighted symbol values of the weighted combinations of symbols; and
normalizing by dividing each of the summed corresponding weighted symbol values by a number of the corresponding weighted symbol values to produce the combined corresponding symbols.

20. The at least one non-transitory computer storage medium of claim 18, wherein:
each of the corresponding symbols is represented by at least two signal properties, and combining the corresponding symbols comprises averaging each of the at least two signal properties.

* * * * *